United States Patent
Zuo

(10) Patent No.: US 11,270,925 B2
(45) Date of Patent: Mar. 8, 2022

(54) HEAT DISTRIBUTION DEVICE WITH FLOW CHANNELS

(71) Applicant: Google LLC, Mountain View, CA (US)

(72) Inventor: Xu Zuo, Saratoga, CA (US)

(73) Assignee: Google LLC, Mountain View, CA (US)

( * ) Notice: Subject to any disclaimer, the term of this patent is extended or adjusted under 35 U.S.C. 154(b) by 87 days.

(21) Appl. No.: 16/885,634

(22) Filed: May 28, 2020

(65) Prior Publication Data

US 2021/0375714 A1    Dec. 2, 2021

(51) Int. Cl.
*H01L 23/367* (2006.01)
*H01L 23/46* (2006.01)

(52) U.S. Cl.
CPC .......... *H01L 23/3675* (2013.01); *H01L 23/46* (2013.01)

(58) Field of Classification Search
CPC .......................... H01L 23/3675; H01L 23/46
See application file for complete search history.

(56) References Cited

U.S. PATENT DOCUMENTS

| | | | |
|---|---|---|---|
| 6,154,369 A | 11/2000 | Martinez, Jr. et al. | |
| 6,400,012 B1 | 6/2002 | Miller et al. | |
| 6,688,381 B2 | 2/2004 | Pence et al. | |
| 6,804,275 B2 | 10/2004 | Miyajima et al. | |
| 6,936,501 B1 | 8/2005 | Too et al. | |
| 6,989,991 B2 | 1/2006 | Barson et al. | |
| 7,002,247 B2 | 2/2006 | Mok et al. | |
| 7,092,255 B2 | 8/2006 | Barson et al. | |
| 7,117,928 B2 | 10/2006 | Chen | |
| 7,201,217 B2 | 4/2007 | Johnson et al. | |
| RE41,576 E | 8/2010 | Bunyan et al. | |
| 8,077,460 B1 | 12/2011 | Dede et al. | |
| 8,243,451 B2 | 8/2012 | Dede et al. | |
| 9,219,022 B2 | 12/2015 | Parida | |
| 9,241,423 B2 | 1/2016 | Chiu | |
| 9,282,675 B2 | 3/2016 | Campbell et al. | |
| 9,418,909 B1 * | 8/2016 | Chaware | H01L 24/26 |
| 9,523,541 B2 | 12/2016 | Kawaura et al. | |
| 9,736,963 B2 | 8/2017 | Pons et al. | |
| 9,861,015 B2 | 1/2018 | Sagneri et al. | |
| 10,028,410 B2 | 7/2018 | Parida | |
| 10,172,258 B2 | 1/2019 | Bodenweber et al. | |
| 10,244,654 B2 | 3/2019 | Parida | |

(Continued)

OTHER PUBLICATIONS

Extended European Search Report for European Patent Application No. 20211024.3 dated Dec. 17, 2021. 8 pages.

*Primary Examiner* — Peniel M Gumedzoe
(74) *Attorney, Agent, or Firm* — Lerner, David, Littenberg, Krumholz & Mentlik, LLP

(57) ABSTRACT

A heat distribution device includes a main body, a recessed cavity and a plurality of ribs. The a recessed cavity is positioned within the main body and includes an interior surface, a peripheral wall extending around and defining the interior surface, and a central point within the recessed cavity. A plurality of ribs extend away from the interior surface of the recessed cavity. The plurality of ribs are concentrically arranged around the central point and define a plurality of channels therebetween. Each of the plurality of ribs have a top surface sloping toward the central point. The plurality of ribs are arranged so that the top surfaces of the plurality of ribs collectively form a non-planar surface within the heat distribution device.

20 Claims, 14 Drawing Sheets

(56) References Cited

U.S. PATENT DOCUMENTS

| | | |
|---|---|---|
| 10,265,812 B2 | 4/2019 | Boday et al. |
| 10,278,306 B2 | 4/2019 | Brunschwiler et al. |
| 10,297,525 B2 | 5/2019 | Gong et al. |
| 10,314,201 B2 | 6/2019 | Tsai |
| 10,356,945 B2 | 7/2019 | Rush et al. |
| 10,462,931 B2 | 10/2019 | Suzuki et al. |
| 10,462,932 B2 | 10/2019 | Gaskill |
| 10,548,240 B1 | 1/2020 | Iyengar et al. |
| 10,548,245 B2 | 1/2020 | Lipp et al. |
| 2010/0170657 A1 | 7/2010 | Kaslusky |
| 2012/0063085 A1 | 3/2012 | Dede |
| 2012/0063091 A1 | 3/2012 | Dede et al. |
| 2017/0062377 A1* | 3/2017 | Salzman .............. H01L 23/492 |
| 2018/0160565 A1 | 6/2018 | Parida |

* cited by examiner

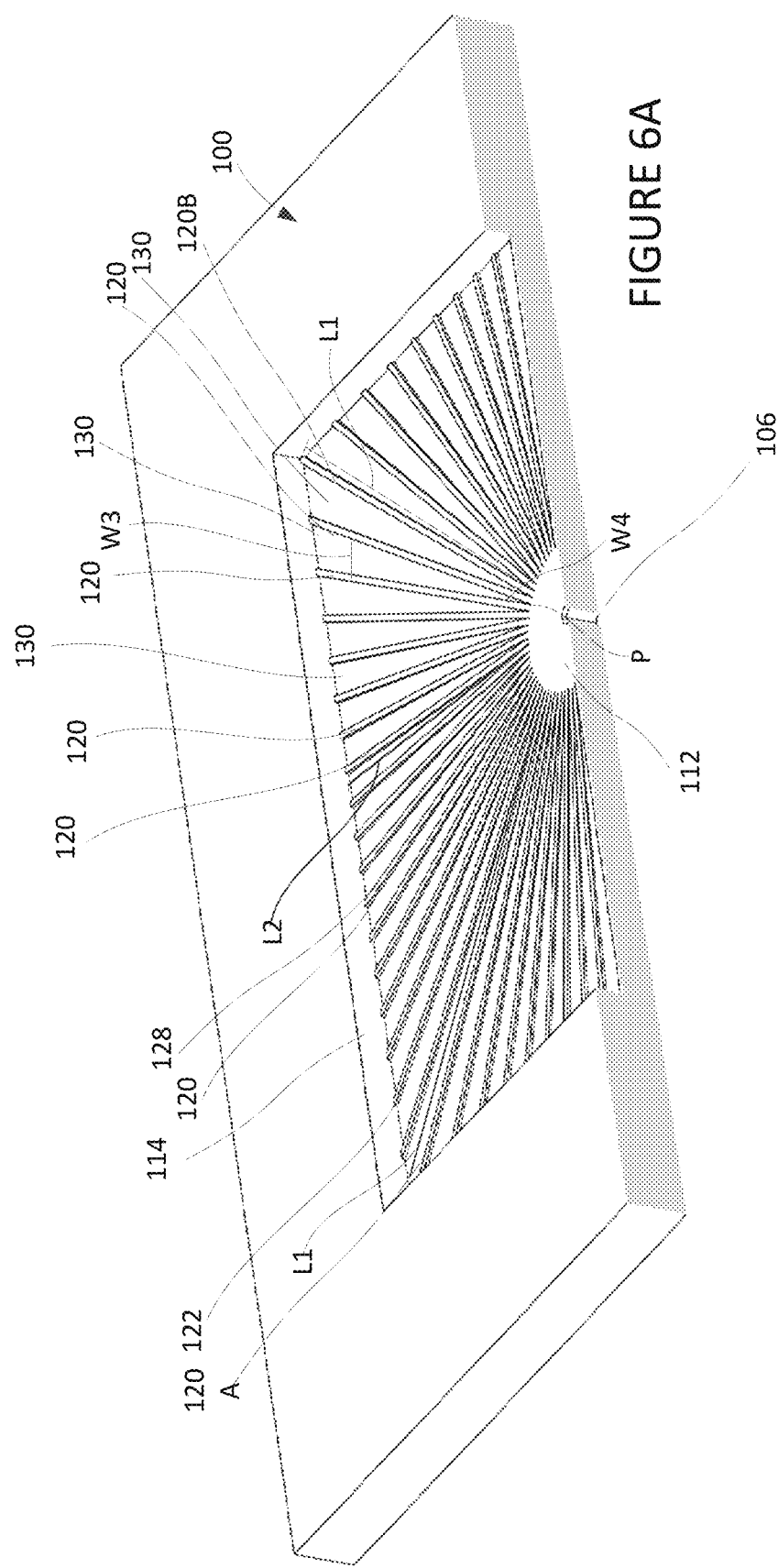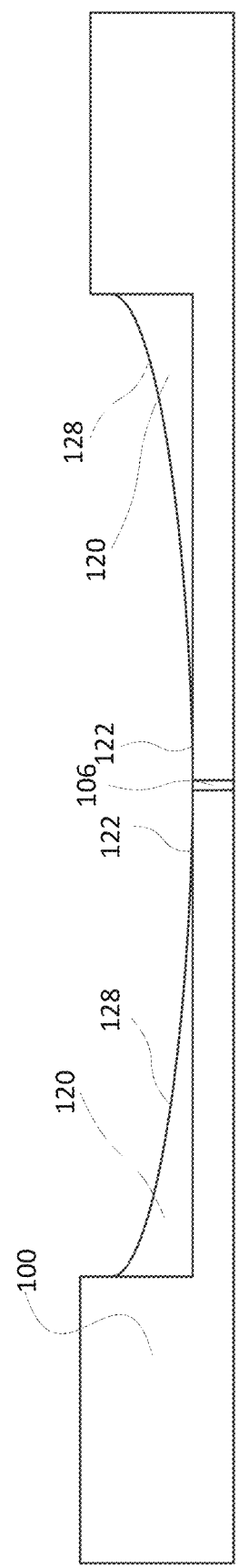
FIGURE 6A
FIGURE 6B

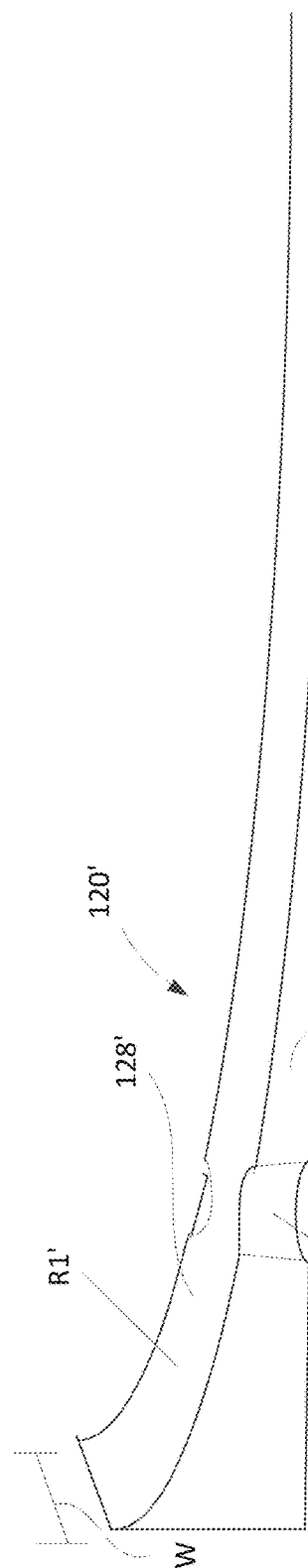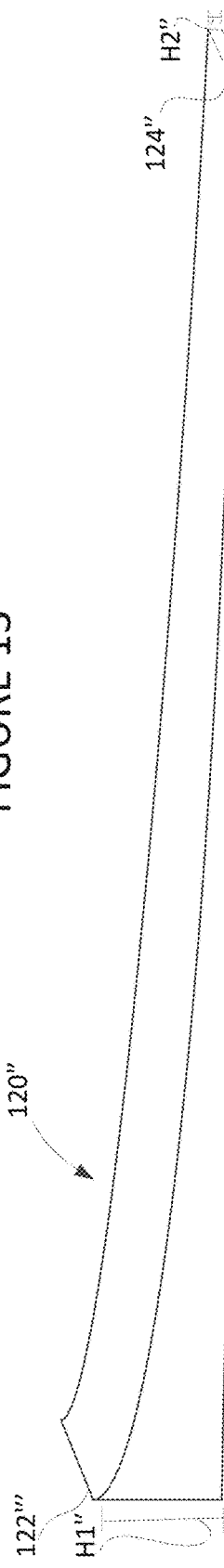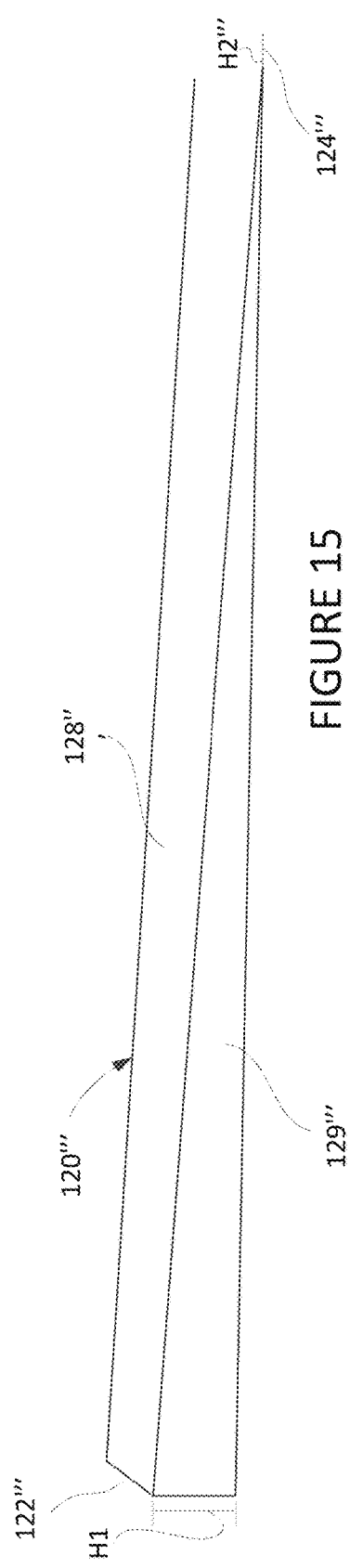

400

--- providing a heat dissipation device comprising a main body having an interior surface, a vent aperture extending through the interior surface and positioned within the main body, a plurality of ribs concentrically arranged around the vent aperture and defining a plurality of channels therebetween, each of the plurality of ribs having a top surface sloping toward the vent aperture, wherein the plurality of ribs are arranged so that the top surfaces of the plurality of ribs collectively form a non-planar surface within the heat dissipation device — 410

↓ depositing a thermal interface material onto the interior surface; — 420

↓ joining a semiconductor chip to the top surfaces of the ribs, the thermal interface material being positioned between the semiconductor chip and the ribs, — 430

↓ applying pressure to the exposed surface of the chip so as to cause the thermal interface material to be dispersed radially and tangentially across an opposed bottom surface of the chip and through the channels toward the vent aperture. — 440

FIGURE 17

HEAT DISTRIBUTION DEVICE WITH FLOW CHANNELS

BACKGROUND

This application relates to the field of electronic devices, and specifically the field of heat distribution devices for thermal management and cooling of microelectronic elements, such as semiconductor chips. Such heat distribution devices can be utilized within a microelectronic assembly to aid in the reduction of heat generated by microelectronic elements within the assembly.

BRIEF SUMMARY

Aspects of the present disclosure are advantageous for chip assemblies utilizing heat distribution devices manufactured according to aspects of the disclosure. One aspect of the disclosure provides a heat distribution device that includes a main body, a recessed cavity positioned within the main body, and a plurality of ribs. The recessed cavity may have an interior surface, a peripheral wall extending around and defining the interior surface, and a central point within the recessed cavity. A plurality of ribs may extend away from the interior surface of the recessed cavity. The plurality of ribs concentrically arranged around the central point and defining a plurality of channels therebetween. Each of the plurality of ribs may have a top surface sloping toward the central point. The plurality of ribs may be arranged so that the top surfaces of the plurality of ribs collectively form a non-planar surface within the heat distribution device. The heat distribution device can further includes a vent aperture positioned at the central point. According to some examples, the top surface of each of the plurality of ribs includes a radius of curvature. For example, the non-planar surface may be a concave surface or a convex surface. The plurality of ribs can further include a first end and an opposed second end adjacent the central point. In some examples, the first end may have a first height greater than a second height at the second end. The second end may be flush with the interior surface of the recessed cavity.

In some examples, the plurality of ribs include a first end and an opposed second end adjacent the central point. The first end may have a first height greater than a second height at the second end. In one example, an edge of the second end may be flush with the interior surface of the recessed cavity. In another example, the second height may extend away from the interior surface.

According to another aspect of the disclosure, a heat distribution device includes a main body, a vent aperture positioned within the main body, and a plurality of ribs. The ribs are concentrically arranged around the vent aperture and define a plurality of channels therebetween. Each of the plurality of ribs may have a top surface that slopes toward the vent aperture. The plurality of ribs may be arranged so that the top surfaces of the plurality of ribs collectively form a non-planar surface within the heat distribution device. In some examples, each of the plurality of ribs may include a first end and an opposed second end. A first height of each rib may be greater than a second height of each rib. The second end of each of the plurality of ribs may be positioned adjacent the vent aperture. Additionally, the second end of each of the plurality of ribs may be flush with a surface of the main body. In other examples, the second ends of the plurality of ribs may be concentrically arranged and spaced apart from the vent aperture so as to form a central area between each of the second ends of the plurality of ribs and the vent aperture.

In some examples, the top surface of each of the plurality of ribs includes a radius of curvature. In one example, the non-planar surface is a concave surface, but in other examples, the non-planar surface may be a convex surface.

In some examples, the heat distribution device further includes a recessed cavity within the main body, and the plurality of ribs may be positioned within the recessed cavity. A peripheral wall may extend around the recessed cavity. Each of the plurality of ribs may have a first end positioned directly adjacent the peripheral wall and a second end positioned directly adjacent the vent aperture.

A microelectronic assembly includes a heat distribution device, a semiconductor chip, and a thermal interface material. The heat distribution devices includes a main body, a recessed cavity within the main body, a vent aperture within the cavity, a plurality of sloped ribs extending radially around the vent aperture, and a plurality of channels formed in respective spaces between each of the sloped ribs. The semiconductor chip may be positioned at least partially within the recessed cavity and overlie the top surfaces of the sloped ribs. An active surface of the chip may face toward the plurality of sloped ribs. A thermal interface material disposed within the channels and between the semiconductor chip and a surface of the recessed cavity.

In one example, the semiconductor chip includes edge surfaces joined together and forming four corners. A first contact pressure between the semiconductor chip and the thermal interface material is higher at a central region of the semiconductor chip, than a second contact pressure at the four corners of the semiconductor chip. The central region of the semiconductor chip includes portions of the semiconductor chip that overlie surfaces of the heat distribution device that extend circumferentially around the vent aperture.

In another example, a contact pressure between the semiconductor chip and the thermal interface material is evenly distributed across the active surface of the semiconductor chips.

In another example, the semiconductor chip has at least one edge that has a length greater than or equal to 2.5 inches.

According to another aspect of the disclosure, a method of manufacturing a chip assembly includes providing a heat distribution device comprising a main body having an interior surface, a vent aperture extending through the interior surface positioned within the main body, a plurality of ribs concentrically arranged around the vent aperture and defining a plurality of channels therebetween, each of the plurality of ribs having a top surface sloping toward the vent aperture, wherein the plurality of ribs are arranged so that the top surfaces of the plurality of ribs collectively form a non-planar surface within the heat distribution device; depositing a thermal interface material onto the interior surface; joining a microelectronic element to the top surfaces of the ribs, the thermal interface material being positioned between the microelectronic element and the ribs, and applying pressure to the exposed surface of the microelectronic element so as to cause the thermal interface material to be dispersed radially and tangentially across an opposed bottom surface of the microelectronic element and through the channels toward the vent aperture.

According to one example, an overmold may be provided over the exposed surface of the semiconductor chip.

BRIEF DESCRIPTION OF THE DRAWINGS

FIG. 6A is an enlarged cross-sectional perspective view of a portion of the heat distribution device shown in FIG. 2.

FIG. 6B is a schematic cross-sectional view taken across line A-A of FIG. 2.

FIG. 13 is another example rib according to aspects of the disclosure.

FIG. 14 is another example rib according to aspects of the disclosure.

FIG. 15 is another example rib according to aspects of the disclosure.

FIG. 17 is a flow chart showing a method of manufacture according to aspects of the disclosure.

DETAILED DESCRIPTION

Overview

Figure 1A:
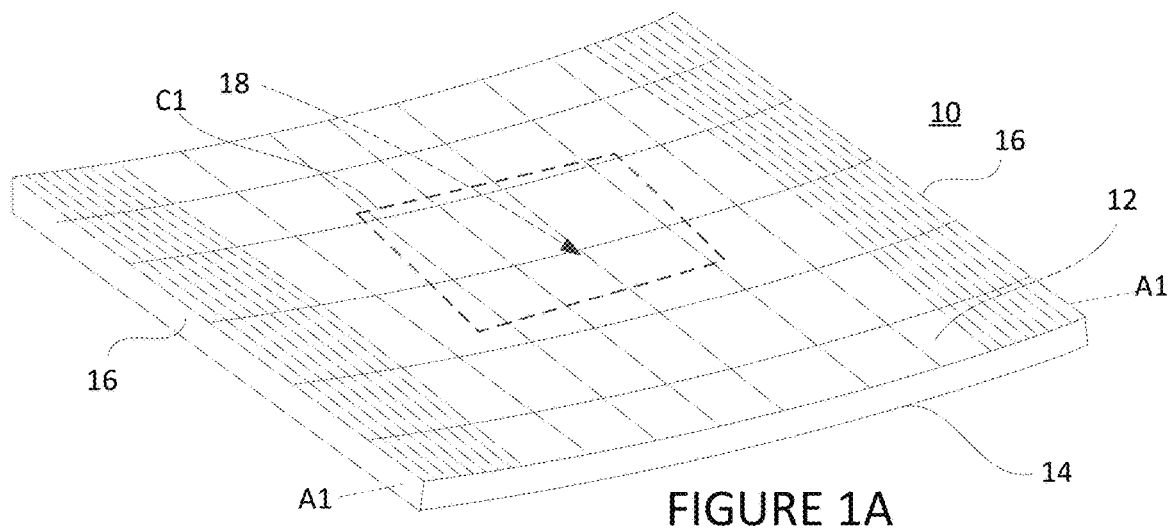
FIG. 1A is an example chip illustrating an example curvature in accordance with aspects of the disclosure.

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein. Further, to the extent possible, similar reference numerals will be used to describe similar elements.

Heat distribution devices are commonly used to cool microelectronic elements, in a microelectronic assembly. Such heat distribution devices can include heat sinks, water blocks, cold plates, and the combination of one or more of these and other devices. Examples of microelectronic elements can include microelectronic chips, semiconductor chips, non-semiconductor chips, memory chips, integrated circuit chips and the like. It is to be appreciated that discussion of the heat distribution device will be made in reference to a "chip," but the heat distribution devices discloses herein are not limited to use with a chip, or any particular type of chip, and can encompass any microelectronic element that can benefit from a heat distribution device.

Traditional heat distribution devices are less effective for larger chips, such as chips larger than 2.5 inches on at least one side. Larger chips have an increased degree of curvature, making it difficult to form a uniform bond across an entire surface of a chip and another component in a package assembly. For example, the surfaces of a chip typically include some type of curvature, which increases with the size of the chip. The curvature can also result from different manufacturing process, and structural designs and materials, as well as during chip packaging and reflow.

Figure 1B:
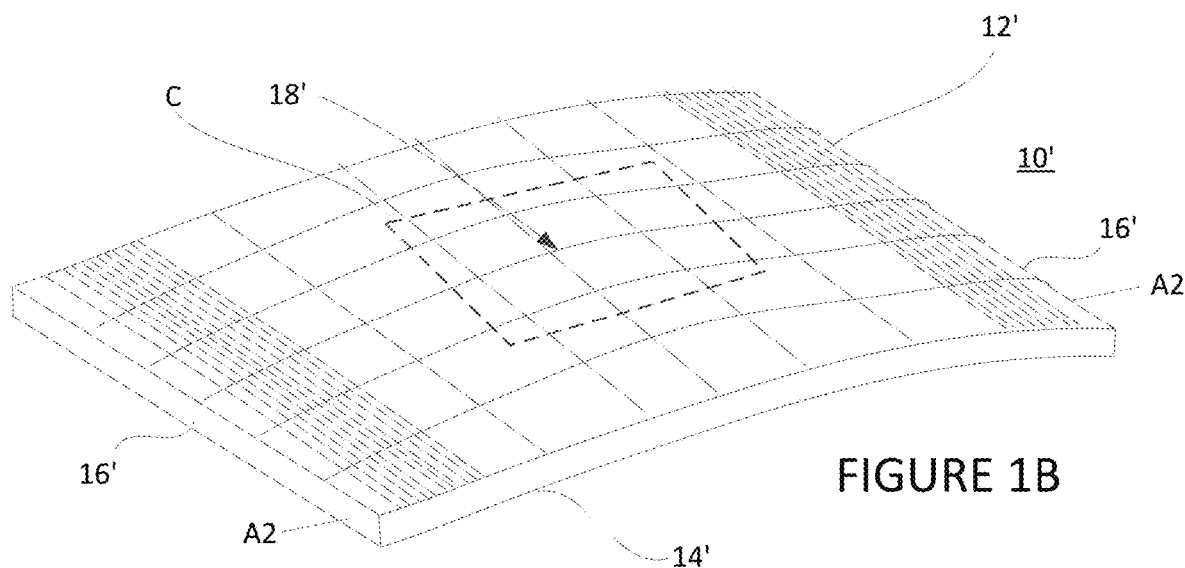
FIG. 1B is an example chip illustrating an example curvature in accordance with aspects of e disclosure.
Figure 1C:
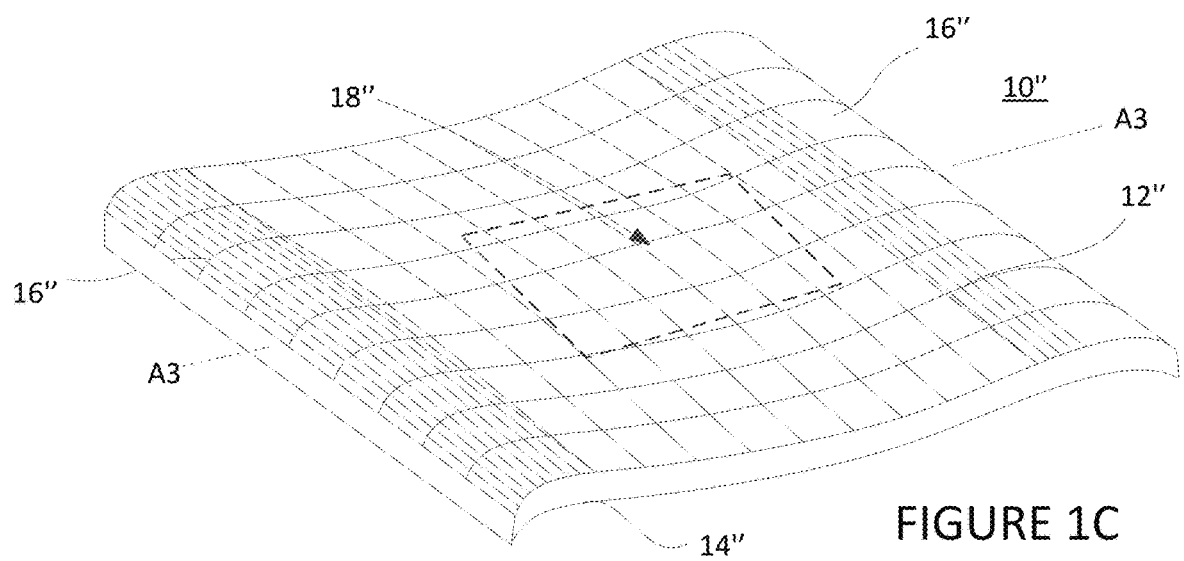
FIG. 1C is an example chip illustrating an example curvature in accordance with aspects of the disclosure.

Common shapes for curvature of chips having an increased size include the semiconductor chips shown in FIGS. 1A-1C. FIG. 1A illustrates a chip 10 having a top and active surface 12, a bottom surface 14, and opposed outer edges 16. Chip 10 is shown in in the face-up position, with active surface 12 having a concave curvature. This curvature causes edges 16 of chip 10 to curve inward. A reference plane A1 is shown extending across chip 10. Outer edges 16 are shown curving upward and away from plane A1, whereas a central portion 18 of chip 10 is shown recessed and positioned below plane A1, such that center 18 is positioned below the outer edges 16.

Chip 10' has an active surface 12' in the face-up position with a convex curvature and an opposed bottom surface 14', as shown in FIG. 1B. Outer edges 16' curve downward relative to a center 18' of the chip 10'. A reference plane A2 is shown. Center 18' is curved and extends upward and away from plane A2, as compared to outer edges 16' which curve downward and away from plane A2. Outer edges 16' are therefore positioned below center 18'.

A chip having an "m"-shaped curvature when in the face-up position is shown in FIG. 1C. Reference plane A3 extends through a center of chip 10". As shown, outer edges 16" and center 18" will be positioned a similar distance downward and away from plane A3, whereas portions of chip 10" positioned therebetween will be positioned upward and away from plane A3 (forming the peaks of the "m" shape).

When a thermal interface material ("TIM") is joined to a larger chip and one that may include a degree of curvature, such as shown in FIGS. 1A-1C, contact pressures on the TIM impact thermal resistance, cooling efficiency, and total cost of manufacturing the chip assemblies. Contact pressure is more easily controlled when chip size is small (<2 inches on each side). When the chip size is large (>2.0 inches on each side, including >2.5 inches on each side), it is extremely difficult to control the TIM contact pressure with traditional cold plate/heatsink designs because such designs cannot accommodate the variables among chip size and shape across a large surface area.

To address the shortcomings of current heat distribution devices and chip assemblies utilizing chips having increased size and shape, a heat distribution device, as well as a chip assembly incorporating the heat distribution device, are disclosed that can increase contact pressure between a chip and the TIM. This, in turn, reduces heat within the package assembly. Furthermore, the design of the heat distribution device can be utilized for chips of different sizes and shapes, including those with large surface areas. As noted above, heat distribution devices can include heat sinks, cold plates, and the like. For ease of discussion, reference will be made to the heat distribution device as a cold plate, but it should be understood that the heat distribution device may include other structures than cold plates.

A cold plate can include an enlarged cavity with a pattern of raised fins or ribs and channels within the cavity. In one example, the cold plate may include a cavity within a central portion of the cold plate. A central point within the cavity can include a vent aperture that extends through the thickness of the cold plate and that is positioned within the center of the cavity.

Raised fins or ribs may be positioned within the cavity and radially extend around a circumference of the vent aperture. Channels may be disposed between each of the raised ribs.

The height of an individual rib may vary along its length. For example, a rib may have a sloped top surface that slopes toward the vent aperture. In such example, the outermost edges of each rib can have a first height in a vertical direction that is greater than a second height of the opposed interior edge closest to the vent aperture or vice versa. The top surfaces may slope toward the center or may additionally or alternatively have a radius of curvature so that at least a portion of the top surfaces of the ribs are curved surfaces.

The collective combination of the ribs and respective sloped top surfaces can create any desired surface within the central cavity. In the example where the top surfaces of the ribs are concave and slope downward toward the vent aperture, the collective top surfaces of the ribs within the cavity can create an overall concave surface. Similarly, where the top surfaces of the ribs slope upward from the outer edge toward the central opening, the collective top surfaces of the ribs can create an overall convex surface. Numerous types of surfaces created from the collective top surfaces of the ribs are also contemplated within the scope of the disclosure.

The cold plate may be implemented within a semiconductor chip assembly to dissipate the heat generated by the chip. For example an enlarged chip can be attached to the cold plate with a TIM, such as a thermal paste. The concave surface created by the sloped ridges will compensate for the concave surface or curved edges of a chip. This configuration allow for the cold plate to be used with chips of various sizes and shapes, including larger chips 2.5 mm in size along at least one edge, or even greater than 2.5 mm and including at least 5 mm, while still providing good contact pressure between the chip and the plate. Such contact pressure cannot be easily achieved using conventional heat spreaders.

The cold plate can be incorporated into a chip assembly to dissipate heat generated by the components within the assembly. A TIM, such as a thermal paste, may be used to join the chip to the cold plate, as well as to help further dissipate heat within the assembly. The thermal paste may be provided onto the top surfaces of some or all of the ribs within the cavity of the cold plate. The chip may then be placed into the cavity and pressure applied to the chip and TIM. The application of pressure on the chip as it is joined to the cold plate will cause the thermal paste to flow toward the vent aperture, as well as to become distributed throughout the channels. The chip can further self-center within the thermal paste within the cavity, ribs, and channels, which will further compensate for any differences in planarity between the chip and cold plate.

The distribution of the thermal paste within the channels and cavity enhances contact between the chip and the thermal paste. Contact pressure at the central portion of the chip can be greater than the contact pressure at the outermost edges of the chip. This can be beneficial to distribute heat at the center of the chip, the hottest portion of the chip, especially when chips are larger in size.

The disclosed heat distribution structure allows for a relatively even distribution of contact pressure between the chip and the TIM. To increase the contact pressure, the features of the raised ribs can be modified, such as the thickness, height, and shape of the slope of the rib.

Thus, the features disclosed herein may provide for a heat distribution structure that utilizes a pre-determined arrangement of ribs to increase contact pressure between the chip and the TIM. Such features may address the shortcomings associated with joining a chip having a large planar surface to a surface of a heat distribution device, due to the curved shape of a chip resulting from a large surface area, as well as defects during chip manufacture and the like.

Example Cold Plate

Figure 2:
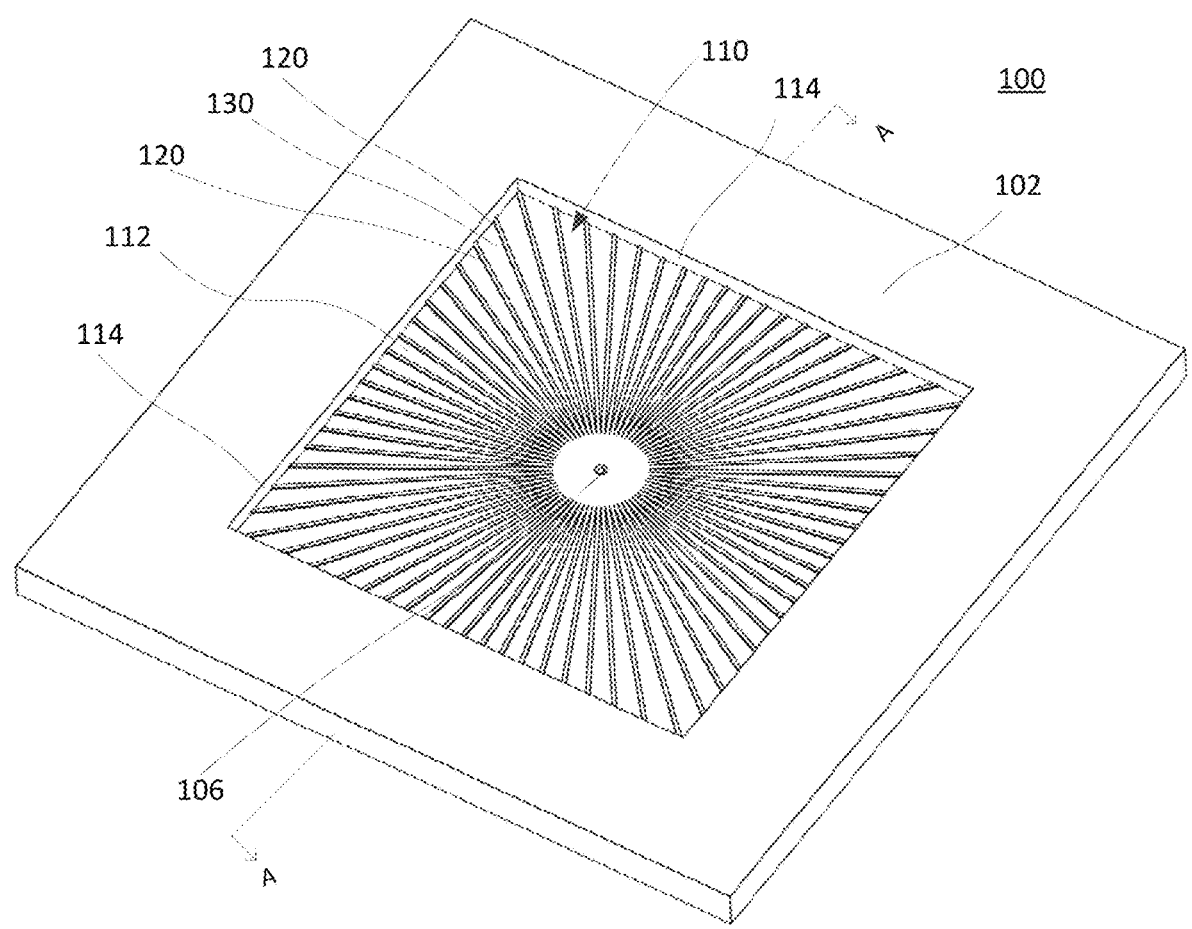
FIG. 2 is a perspective view of an example heat distribution device in accordance with aspects of the disclosure.

FIG. 2 is an example heat distribution device, such as a cold plate 100. Cold plate 100 generally includes a recessed cavity 110 with a pattern of raised fins or ribs 120 and channels 130 formed between each of the raised ribs 120 that are disposed within cavity 110. Cold plate may be formed from known heat dissipating materials, such as aluminum, copper, silver, and metal alloys. Cold plate 100 may also be manufactured using molding, machining, and similar processes.

Figure 3:
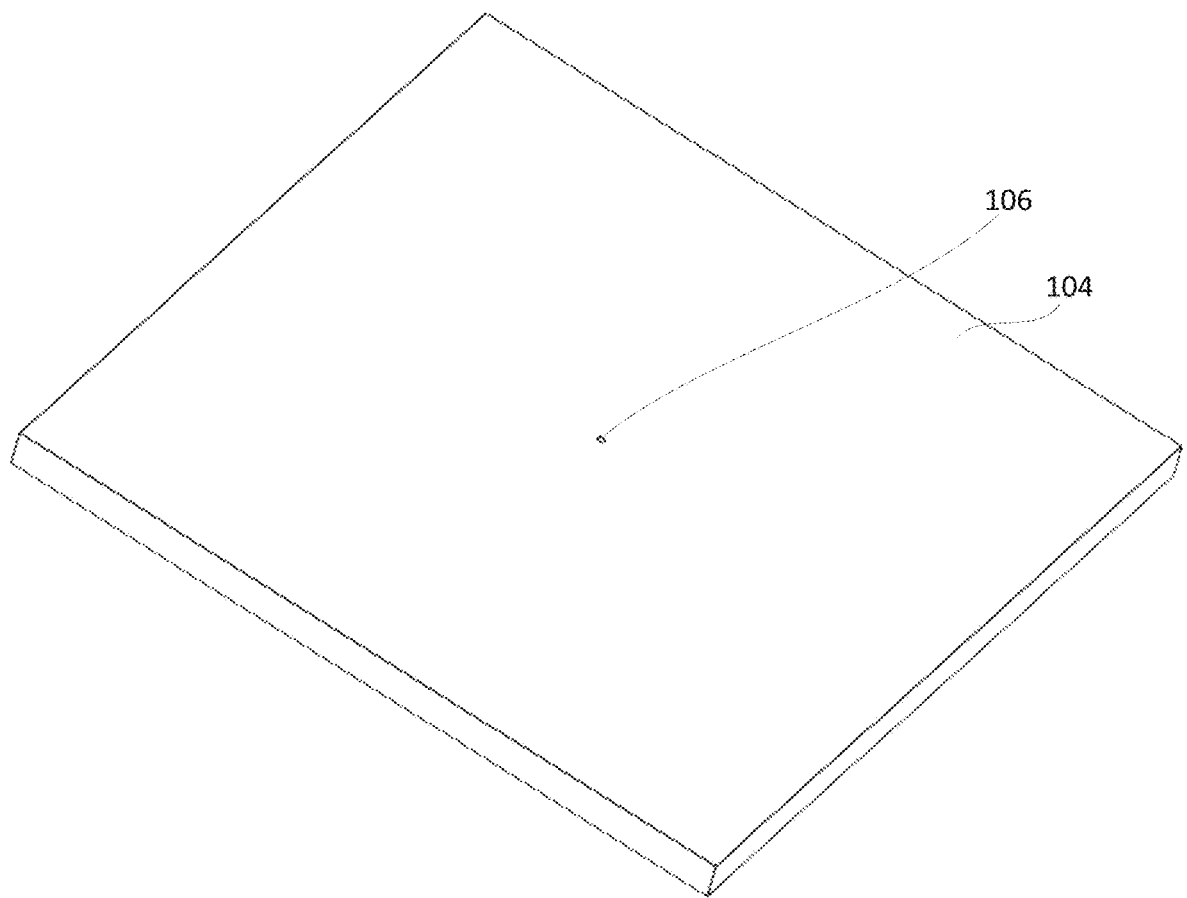
FIG. 3 is a bottom perspective view of the heat distribution device of FIG. 2.

Cold plate 100 includes an outer top surface 102 and an opposed bottom surface 104 (FIG. 3). Bottom surface 104 is shown as a continuously planar surface, but in other examples the surface may vary. Cavity 110 is defined by a recessed interior surface 112 and a peripheral edge 114 that extends upwardly from the recessed interior surface 112 to the outer top surface 102 of cold plate 100. Outer top surface 102 of cold plate 100 extends parallel to interior surface 112 of cavity 110 and forms a peripheral surface extending around cavity 110.

A vent aperture 106 extends through the thickness of cold plate 100 from interior surface 112 of cavity 110 through bottom surface 104 of cold plate 100. This allows vent aperture 106 to have an opening at both interior surface 112 and bottom surface 104. Vent aperture 106 may be centrally position with respect to the periphery of the cold plate 100, as well as the periphery of the cavity 110, though in other examples the position of aperture 106 may be adjusted. Further, the size, shape, and position of vent aperture 106 may be modified based on the desired contact pressure to achieve at the center of the chip, as discussed further below. In other examples, vent aperture 106 is omitted from the cold plate altogether.

Both cold plate 100 and cavity 110 may be in the shape of a square, although cold plate 100 and cavity 110 can take on any shape. For example, the cold plate or cavity may be circular, semi-circular, rectangular, or any shape or variation. The shape of the overall cold plate and the shape of the cavity can alternatively differ. For example, the outer shape of the cold plate may be in the shape of a square, but cavity 110 may be in the shape of a circle and vice versa. The overall size of the cavity may also vary, but in one example, cavity 110 is large enough to accommodate a chip that is 2.5 inches long on each edge or larger.

Figure 4:
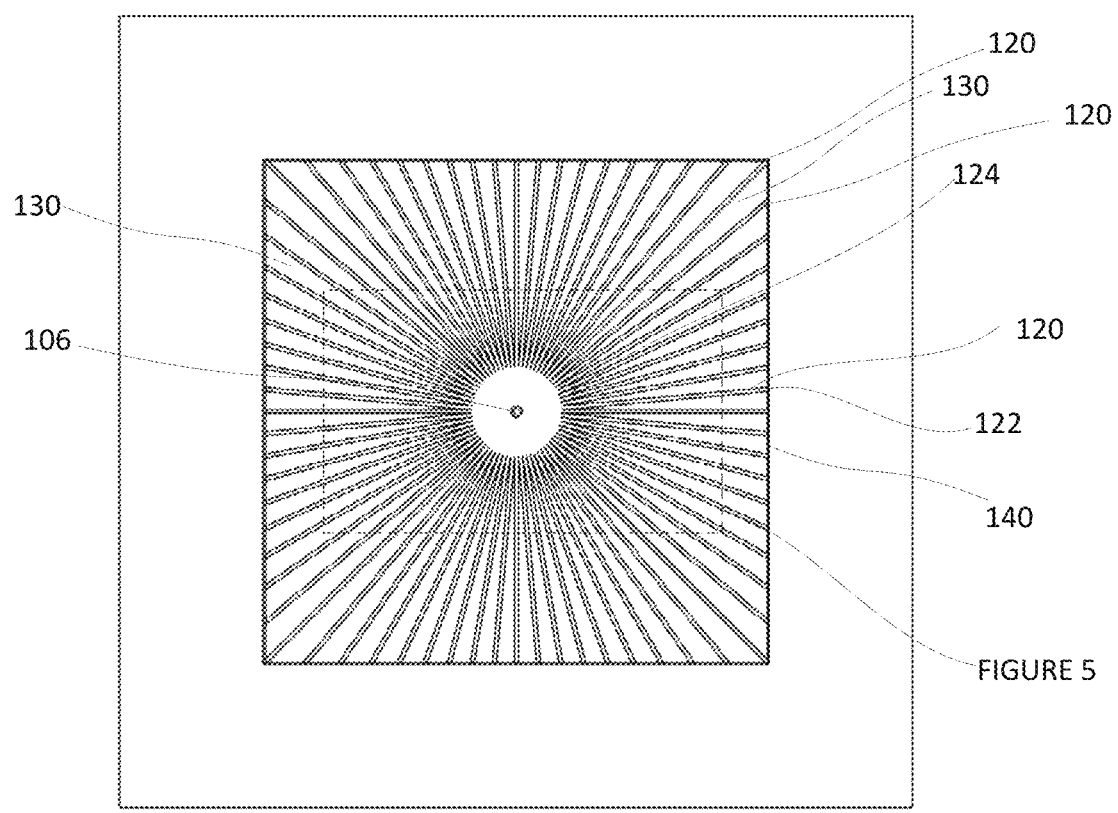
FIG. 4 is a top plan view of the heat distribution device of FIG. 2.
Figure 5:
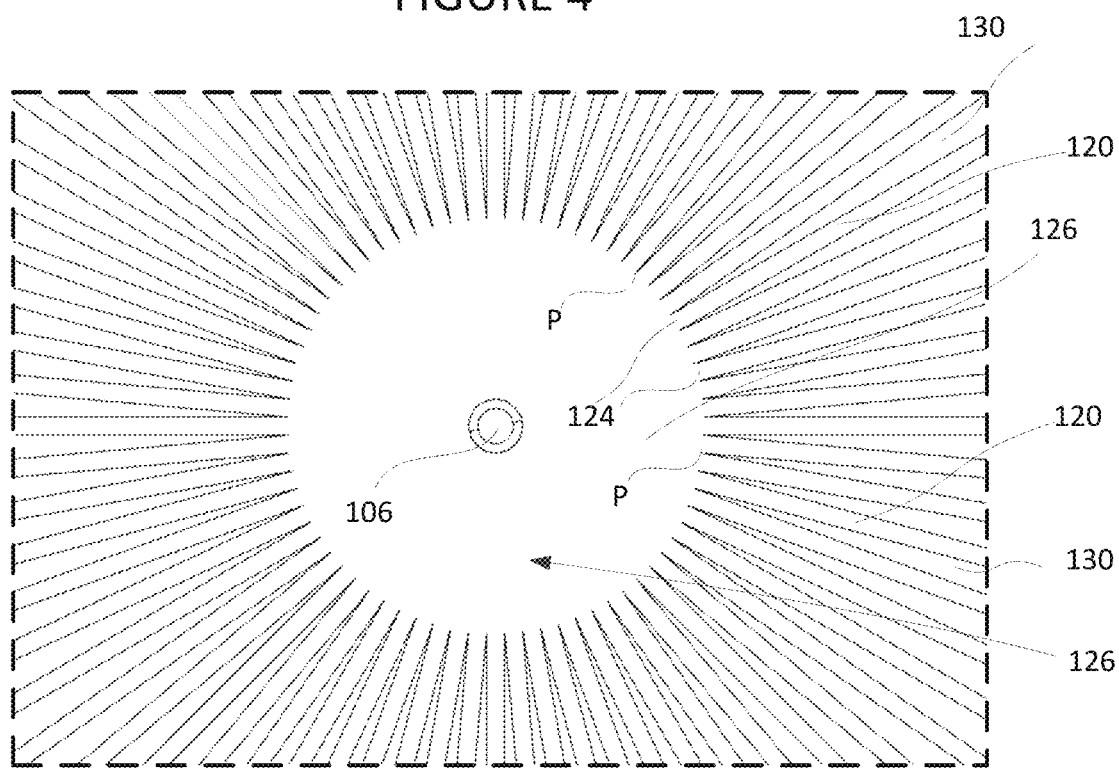
FIG. 5 is an enlarged section of a portion of the heat distribution device shown in FIG. 4.

A plurality of ribs 120 may be positioned within cavity 110 and arranged in a particular pattern. For example, with reference to FIG. 4, a top plan view, and FIG. 5, an enlarged portion of FIG. 4, a plurality of ribs 120 are shown extending around vent aperture 106 in a circular pattern. In this example, there are approximately 72 ribs, but the number of ribs may differ in alternative examples where fewer or greater number of ribs are used. Ribs 120 in cavity 110 of cold plate 100 generally maintain the same characteristics, and will only differ based on length, as discussed below. For ease of discussion, it is to be understood that reference to a rib 120 is applicable to all ribs in cold plate 100. Certain ribs may be further identified to facilitate discussion, but a discussion of those particular ribs should be understood as otherwise possessing the same characteristics as any rib 120.

Ribs 120 may be positioned directly adjacent peripheral edge 114 and extend from peripheral edge 114 toward vent aperture 106. As shown, first end 122 of each rib 120 is spaced away from a first end 122 of each adjacent rib 120. With reference to the enlarged view of FIG. 5, the second end 124 of each rib 120 is evenly spaced away from a directly adjacent second end 124 of each adjacent rib 120.

In this example, second end 124 of each rib 120 terminates at a same circumferential distance away from vent aperture, so that each adjacent rib 120 is evenly and circumferentially spaced away from vent aperture 106. This allows for a space 126 at the center of cavity 110 between vent aperture 106 and each point P. In this example, space 126 is a circular space, but other shapes such as square, semi-circular and the like may be implemented by varying the distance of second end 124 of each rib 120 away from vent aperture 106. In other examples, the second ends 124 of each rib 120 do not need to be evenly spaced away from vent aperture 106 and the second ends 124 can be staggered or arranged in any type of pattern. As will be discussed later, space 126 allows for the collection of fluid at the center of cold plate 100, such as thermal paste or air or gas to help control the contact pressure at the center of a chip that will be joined to cold plate 100.

FIG. 6A is an enlarged cross-sectional perspective views of a portion of cavity and the ribs therein and FIG. 6B is a schematic cross-sectional view. The overall length L of each rib 120 may differ. Due to the radiating pattern of ribs 120 around vent aperture 106, the distance from peripheral edge 114 to a point adjacent vent aperture 106 may vary, such that each rib 120 may have a length that may be different from a directly adjacent rib 120. For example, ribs at the four corners of cavity 110 extend a greater distance to vent aperture 106 than ribs that extend from a point on peripheral edge that is between two adjacent corners. With reference still to FIG. 6A, corner ribs 120A and corner rib 120B positioned at two adjacent corners of cavity 110 have a length L1 that is greater than a length L2 of intermediate rib 120C that is positioned at a point mid-way between ribs 120A and 120B.

Figure 7:
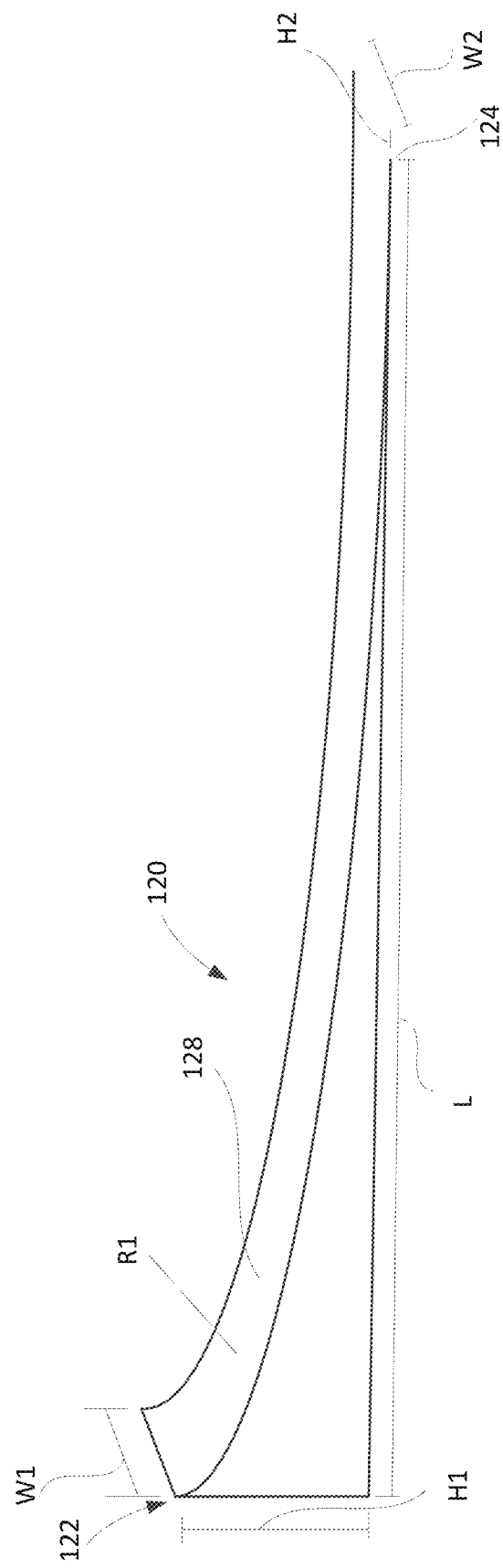
FIG. 7 is a schematic representation of an example rib shown in FIG. 6A according to aspects of the disclosure.

FIG. 7 is a schematic view of a single rib 120 with a second end 124 that is represented as being flush with a surface, such as interior surface 112, to which rib 120 overlies. The height of an individual rib 120 can vary along its length L. For example, with reference to FIG. 7, top surface 128 of rib 120 may slope toward vent opening 106. Rib 120 may have a first height H1 at a first end 122 that is greater than a second height H2 at a second end 124 of rib 120. In the example of FIG. 7, rib 120 will continuously slope toward vent aperture 106, such that second end 124 of rib 120 is flush with interior surface 112, and second height H2 is "0". (See also FIG. 6A.) As shown, top surface 128 of rib 120 may also have a radius of curvature R1 so that at least a portion of rib 120 has a curved surface.

With reference still to FIG. 7, the thickness or width of each rib 120 can remain relatively constant across its length. First end 122 of rib 120 has a width W1 that is substantially equal to the width W2 at the opposed second end 124 of rib 120, which is adjacent vent aperture 106. In other examples, the width may vary along its length. For example, the width W1 at first end 122 of rib 120 may be greater than or smaller than width W2 as the second end 124. Similarly, width W1 and W2 may be equal, but the width may vary one or more times between W1 and W2.

Rib 120 can further include a radius of curvature along its length. In this example, the radius of curvature R1 allows for the creation of a concave surface on each individual rib 120. In other example, there may be multiple radii of curvature, or alternative curvatures that result in a different type of surface, such as a convex surface, being formed on rib 120.

With reference back to FIGS. 4, 5 and 6A, flow channels 130 are formed in the space between each adjacent rib 120. The width of the flow channels can vary along its length based on the distance between two adjacent ribs 120. As best shown in FIG. 6, the width W3 of flow channel 130 adjacent peripheral edge 114 is greater than the width W4 of each flow channel 130 adjacent vent hole 106. Due to the spacing between second ends 124 of directly adjacent ribs 120, flow channels 130 will terminate at a point P adjacent vent aperture 106.

Some or all of the ribs may be integrally formed with the main body of cold plate 100, or one or more ribs may be separately manufactured and attached to interior surface 112 of cavity 110. In one example, ribs 120 are formed from the same material comprising the remainder of cold plate 100. In other examples, each of the ribs 120 is formed from a different material than the main body of the cold plate.

The collective combination of the ribs and respective sloped and concave surfaces can create any desired surface within cavity 110. In this example, where top surfaces 128 of ribs 120 slope or curve downward toward vent aperture 106, the collective top surfaces 128 of ribs 120 within cavity 110 create an overall concave surface. For example, as shown in FIGS. 6A and 6B, top surface 128 of ribs 120 gradually become flush with interior surface 112 of cavity 110. This creates an overall concave surface across cavity 110, where the collective ribs form a surface that is curved inward. In alternative examples, different types of surfaces may be created by utilizing ribs having different shapes and patterns, as will be discussed herein.

Figure 8:
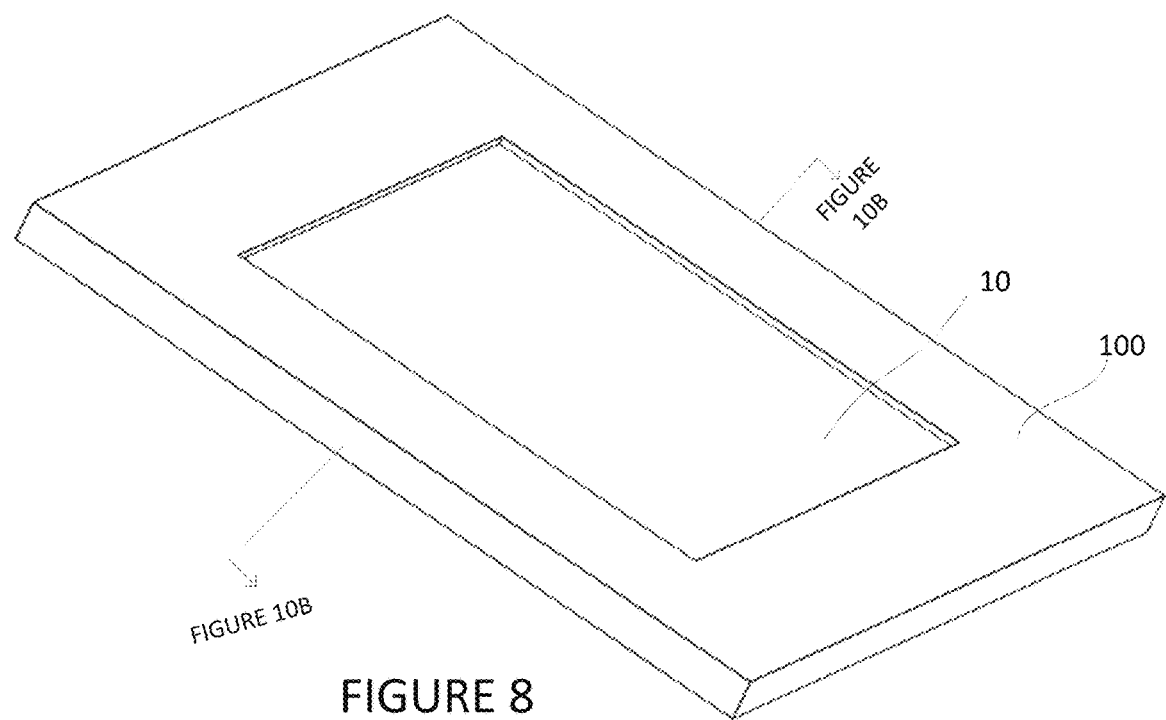
FIG. 8 is a perspective view of an example assembly of a chip within the heat distribution device of FIG. 2 according to aspects of the disclosure.
Figure 9:
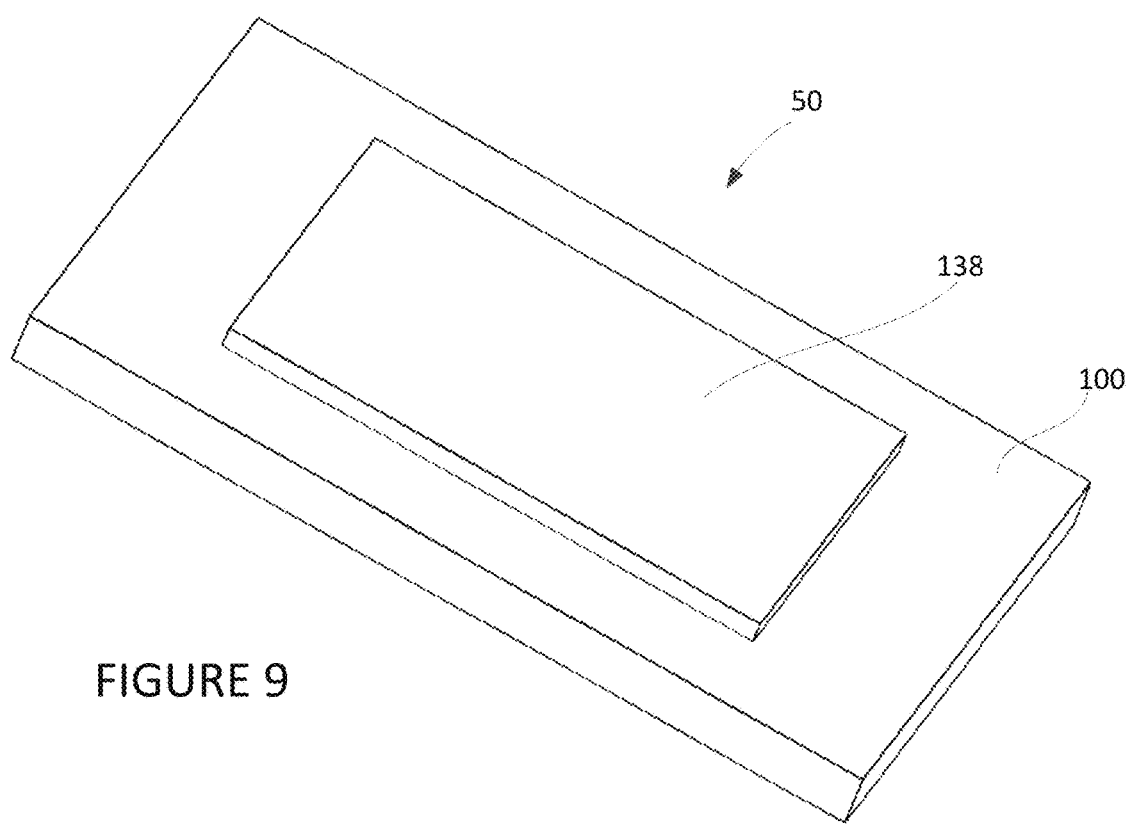
FIG. 9 shows assembly of a chip and an overmold within the heat distribution device of FIG. 2 according to aspects of the disclosure.

The cold plate may be joined with a semiconductor chip to dissipate the heat generated by the chip. For example, FIG. 8 illustrates an example of a chip 10 (as previously discussed) positioned within the cavity of cold plate 100. FIG. 9 illustrates an example completed assembly 50 with an overmold 138 overlying chip 10 and cold plate 100. Although not shown, completed assembly 50 can be further incorporated into another assembly, including attachment to a printed circuit board and the like.

Figure 10A:
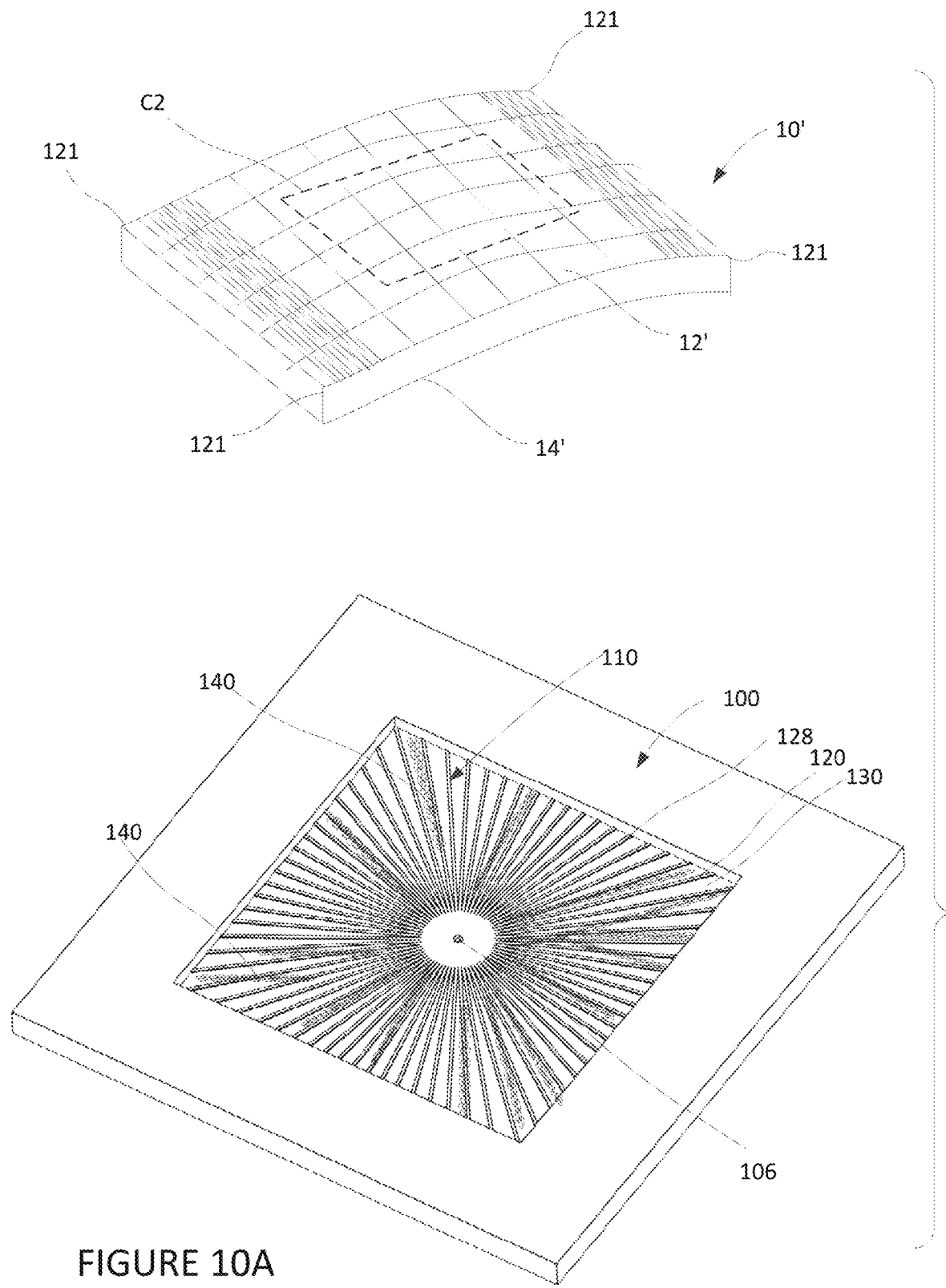
FIG. 10A is an exploded perspective view showing the chip assembly of FIG. 8.

FIG. 10A illustrates an exploded view of the chip and cold plate 100, where the active surface of chip 10' (FIG. 1B) has a convex and curved surface when in the face-up position. As noted above, chip 10' may be a chip of increased size. Chip 10' may be greater than 2.5 inches, and 5 inches or greater on one or more sides. In this example, a TIM may be provided within cavity 110 to aid in thermal conduction between chip 10' and cold plate 100 so as to enhance thermal coupling between them. In one example, TIM is a room-temperature fluid, such as a thermal paste 140. Other thermal interface materials may also be implemented within the system, including other types of thermal adhesives, thermal gels, thermal putties, thermal gap filler, phase change material, metal TIMs, and the like.

Thermal paste 140 may be applied to cold plate 100 in any variety of ways. In one example, thermal paste 140 is provided within certain channels 130. Thermal paste 140 is shown being distributed in several channels 130, but thermal paste 140 can be deposited into any number of channels. When chip 10' is joined to thermal paste 140, thermal paste 140 will flow in both the radial direction and tangential direction. This allows thermal paste 140 to flow along and within the channels toward vent aperture 106, as well as overflow into neighboring channels 130, where needed. Furthermore, thermal paste 140 disperses across the surface contours of the chip. In another example, drops of thermal paste may be provided at certain points on the interior surface 112 of cavity 110, which will similarly be distributed across the surface of chip 10 and ribs 120 and channels 130 within the cavity, when chip 10 is joined to cold plate 100.

Figure 10B:
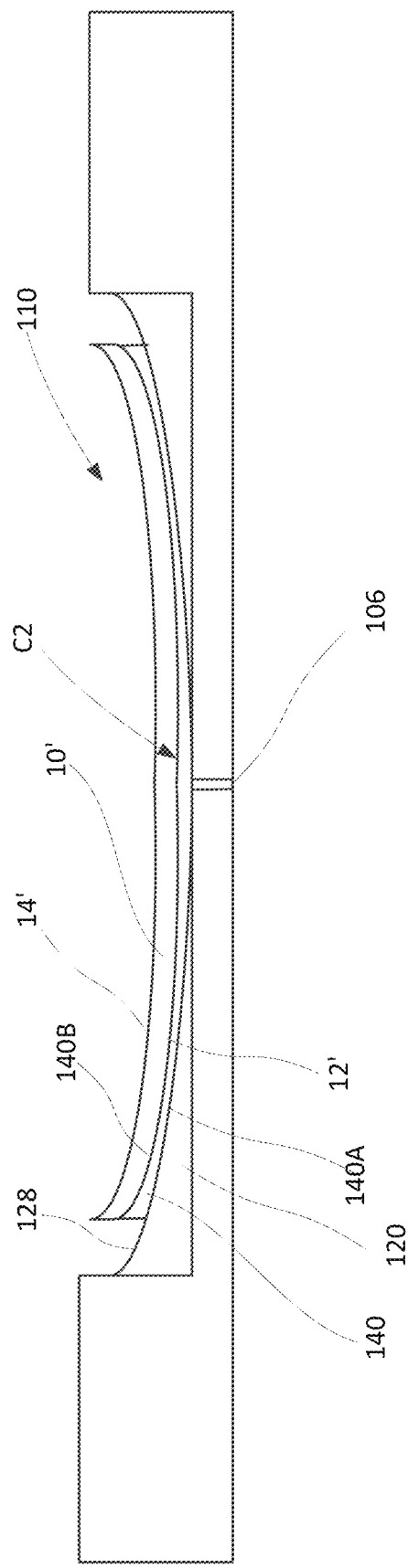
FIG. 10B is a schematic cross-sectional view showing a cross-section of the chip assembly shown in FIG. 8.

As shown in the example of FIG. 10B, a schematic cross-section view of FIG. 8, front and active surface 12' of chip 10' may be joined to cold plate 100 using thermal paste 140. When joined to cold plate 100, chip 10' is in a face-down position, such that the overall shape of chip 10 is concave, and active surface 12' has a concave curvature relative to the top surface of cold plate 100. As shown, thermal paste 140 will have a top surface 140A facing ribs 120 and channels 140, as well as a rear surface 140B facing away from ribs 120 and toward chip 10'. Chip 10' will overlie concave top surfaces 128 of ribs 120 and may contact one or more ribs 120, as well as overlie and contact rear surface 140B of thermal paste 140, and/or be embedded within thermal paste 140. Despite the increased size and the contoured edges of chip 10', the concave shape of ribs 120 compensates for the non-planarity of chip 10' by complementing the now concave top surface 12 of chip 10. This aids in providing a better contact surface between chip 10' and cold plate 100. Furthermore, the tapered flow channels 130 (FIG. 10A) allow for thermal paste 140 to flow and become distributed across the entirety of the surface of the chip 10', as well as in a direction toward vent aperture 106. Due to the configuration of the flow channels, thermal paste 140 can collect in space 126 at or near vent aperture 106. Thermal paste may also flow into the vent aperture 106. Vent aperture 106 can also provide a vent for air bubbles that may be present in the cavity to escape.

The collection of thermal paste 140 at the vent aperture 106 can help to increase contact pressure on the center of the chip 10. Ribs 120 and the thermal paste 140 within channels 130 will further allow for variances in planarity between chip 10' and cold plate 100. Moreover, the chip can self-center within the thermal paste within cavity 110, which will help to further compensate for any differences in planarity between the chip and cold plate.

Cold plate 100 can provide for increased and controlled contact pressure between chip 10' and cold plate 100 according to aspects of the disclosure. Cold plate utilizes ribs 120 with top surfaces 128 that are arranged in a pattern to create an overall concave surface within cavity 110, In an example where cavity 110 includes a plurality of ribs each having a radius of curvature R1' of 2.1 mm, a thickness/width W of 1 mm, and a height H1 of 0.5 mm, as well as a vent aperture 106 having a diameter of 2 mm, increased contact pressure can be achieved in the assembly. In this example where an active surface 12' of chip 10' has a convex shape in the face-up position and is joined in a face-down position to cold plate 100, and thermal paste 140 has a top surface 140A facing ribs 120 of cold plate 100, as well as a rear surface 140B facing chip 10', the overall shape of the chip relative to the top surface of cold plate 100 is a concave shape.

A simulation to determine contact pressure on the thermal paste in this chip configuration indicates that a uniform or evenly distributed contact pressure of approximately 0.18 MPa can be distributed across the entire bottom surface 140B of the thermal paste 140 that faces an active surface of the chip 10'. This evenly distributed contact pressure on the bottom surface 140B of thermal paste 140 by chip 10' can be achieved even with a large difference in coplanarity, such as 0.5 mm, between the increased surface area of chip 10' and top surface of ribs and cold plate 100. Moreover, a high contact pressure of approximately 0.18 MPa can be achieved at the center of the bottom surface of the thermal paste 140, as well as central region C2 of the chip (see also FIG. 1B), which is the hot spot of chip 10. Central region C2 can include any region or point on chip 10' that is in an area central to the four corners 121 of chip 10'. For example, central region C2 can include either or both the portion of chip 10' overlying vent aperture 106 and portion of the cold plate extending immediately around the vent aperture. Central region C2 can further include the exact center of chip C2.

A contact pressure of approximately 0.16 MPa can be achieved at the top surface 140A of thermal paste 140 by flow channels, and a contact pressure of approximately 0.12 MPa can be achieved at the top surface 140A of TIM by ribs 120. Thus, increased contact pressure can be achieved utilizing cold plate 100 according to aspects of the disclosure.

The increased pressure at a central region C2 of the chip can be beneficial to the extent that chips generate the highest amounts of heat at a central location or region of the chip, and are generally hottest at their center. Ensuring high contact pressure at a central region of the chip can help to further ensure the cold plate is operating at optimal conditions, so as to more efficiently distribute heat from the chip assembly. It is to be appreciated that the above parameters discussed with regard to FIGS. 10A-10B provide only one example and that numerous modifications to one or more of the radius of curvature, thickness/width, and height of any one rib may be made, as well as modification to the pattern in which the ribs are arranged, the shape of the cold plate, and other parameters to achieve increased and optimal contact pressure. Moreover, a substantially planar chip can also be utilized in connection with the structures and methods disclosed herein.

Figure 11:
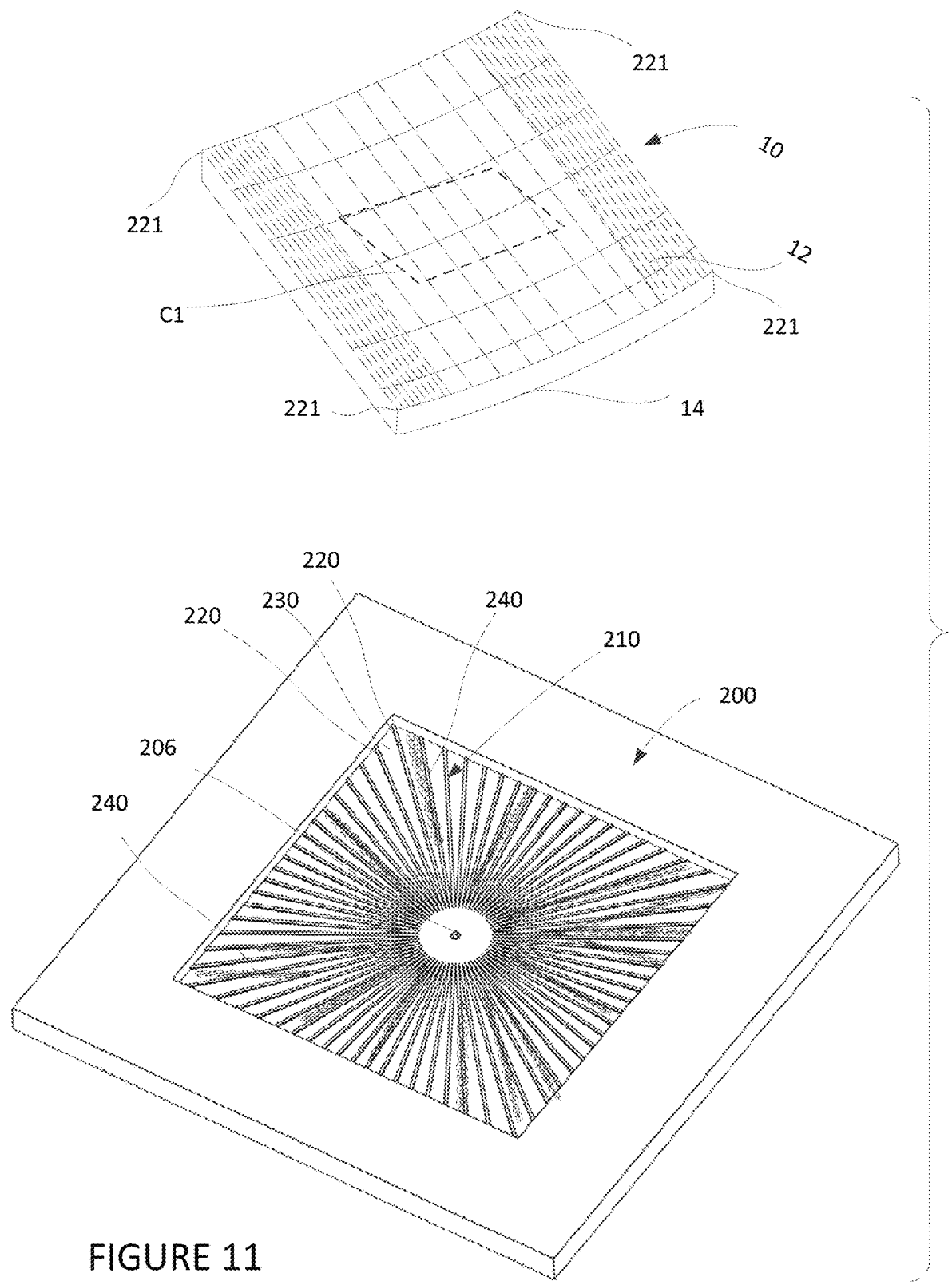
FIG. 11 is an exploded perspective view showing the heat distribution of FIG. 2 and another example chip according to aspects of the disclosure.

Cold plate 100 can be utilized to compensate for chips of different shapes and sizes, while still achieving high contact pressure on the thermal interface material. FIG. 11 illustrates an exploded perspective view of a chip assembly that includes chip 10 (see also FIG. 1A). The only difference between the example of FIGS. 10A-B and 11 is the curvature of the active surface of the chip relative to the top surface of the cold plate. Chip 10 has an active surface with a concave curvature in the face-up position, such that outer edges of chip 10 are oriented upward and a center 18' of chip 10' is positioned downward and away from the outermost edges. Once placed into the face-down position within cold plate 200, the chip 10 can have an overall convex shape relative to the top surface of cold plate 200. Chip 10 may be a larger chip that is larger than 2.5 inches, and in this example, chip 10 can be at least 5 inches on each side. In other examples, the chip may be a much smaller chip that is less than 2.5 inches, or alternatively greater than 5 inches. Cold plate 200 is identical to cold plate 100, and includes concave shaped ribs 220 and channels 230 arranged around vent aperture 206 that collectively form a concave surface within cavity 210. Thermal paste 240 may again be provided within channels 230. Despite the top surfaces 228 of ribs 120 forming a concave surface and chip 10 having an overall convex shape relative to the top surface of cold plate 100 (when in the face-down position), high contact pressure can still be achieved.

An example simulation to determine contact pressure on the thermal paste in this example chip configuration results in a contact pressure distribution ranging between approximately 0.16 MPa and 0.18 MPa across the bottom surface of thermal paste 240, where a contact pressure of 0.18 MPa can be achieved toward a central portion of the bottom surface of the thermal paste 240, even with a large difference in coplanarity, such as 0.5 mm, and chip 10 having a large surface area with a convex surface.

Similarly, the contact pressure at the central region C1 of the chip 10 (see also FIG. 1A) can be greater than the contact pressure of chip 10 at its four corners. In this example, pressure at the four corners of the bottom surface of thermal paste 240 may be approximately 0.15 MPa and a contact pressure at a central region C1 of chip may be approximately 0.18 MPa, such that contact pressure at a central region C1 of chip is 20% more than the contact pressure at the four corners 221 of the chip. As shown, central region C1 can include any region or point on chip 10 that is in an area central to the four corners 221 of chip 10. For example, central region C1 can include either or both the portion of chip 10 overlying vent aperture 106 and portion of the cold plate extending immediately around the vent aperture. Central region C1 can further include the exact center of chip C1.

At the top surface of the thermal paste 240, which faces cold plate 100, a contact pressure of approximately 0.14 MPa can be achieved on portions of thermal paste 240 within the flow channels, and a contact pressure of 0.12 MPa can be achieved on portions of thermal paste 240 contacting ribs 220 of cold plate 200.

The increased pressure at a central region C1 of the chip can be beneficial to the extent that chips generate the highest amounts of heat at a central location or region of the chip, and are generally hottest at their center. Ensuring high contact pressure at a central region of the chip will help to further ensure the cold plate is operating at optimal conditions, so as to more efficiently distribute heat from the chip assembly. It is to be appreciated that these parameters provide only one example and that numerous modifications to one or more of the radius of curvature, thickness/width, and height of any one rib may be made, as well as modification to the pattern in which the ribs are arranged, the shape of the cold plate, and other parameters to achieve increased and optimal contact pressure.

Figure 12:
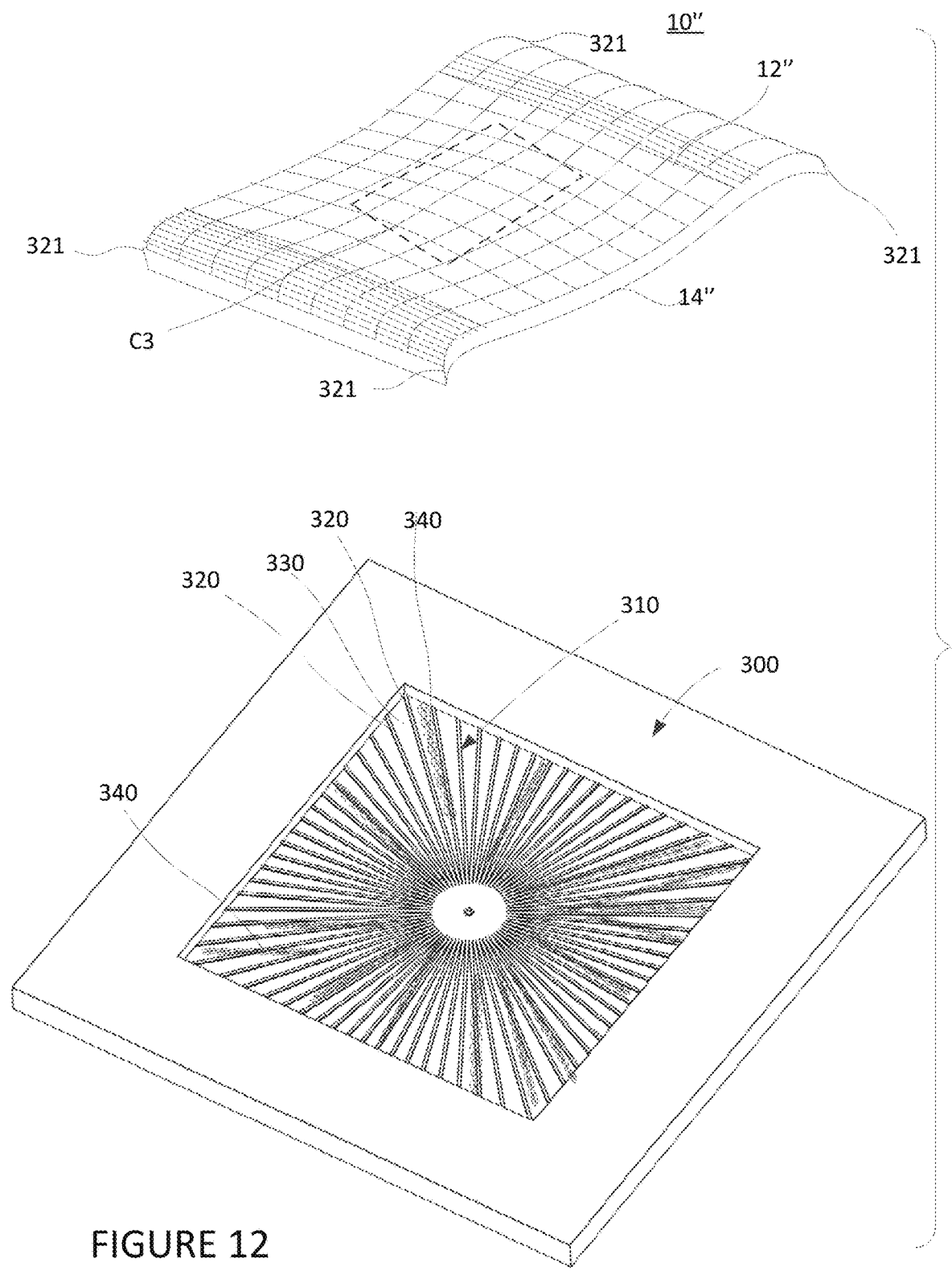
FIG. 12 is an exploded perspective view showing e heat distribution of FIG. 2 and another ample chip according to aspects of the disclosure.

FIG. 12 illustrates another exploded chip assembly utilizing a cold plate 300 that is identical to cold plate 100 and 200 previously disclosed herein. Chip 10" may be an enlarged chip that is greater than 2.5 inches on at least one side, and that is in the shape of a "m," in the face-up position, as previously discussed herein, but will be in a "w" position when positioned within the cold plate in the face-down position. In the face-down position, outermost edges 14" and center 18" will now be curved upwards. When chip 10" is attached to cold plate 300, thermal paste 340 will flow along the active surface 12" of chip 10". As in the prior embodiments, thermal paste 340 will flow throughout cavity 310 in both a radial and tangential direction along and across flow channels 330.

Despite the active surface having a "w"-shaped contour in the face down position that does not complement or precisely match the concave surface created by the arrangement of the plurality of ribs 320 within cavity 310 of cold plate 300, high contact pressure between chip 10" and cold plate can be achieved according to aspects of the disclosure.

As in the previous examples, an example simulation to determine contact pressure on the thermal paste in this example chip configuration indicates that good contact pressure across the bottom surface of thermal paste 340 can be achieved. In one example, contact pressure ranges from approximately 0.16 MPa at the four corners of the bottom surface of thermal paste 340 to approximately 0.18 MPa at a central region of the bottom surface of the thermal paste (which faces the active surface of the chip 10"). This overall high contact pressure distribution can exist even with a large difference in coplanarity, such as 0.5 mm, and chip 10 having a large surface area and a w-shaped surface. At the top surface of the thermal paste 340, a contact pressure of approximately 0.12 MPA can be achieved within the flow channels 330, and a contact pressure of approximately 0.17 MPa at ribs 320. Moreover, high contact pressure of 0.17 MPa can be achieved at the vent aperture 306, which is the hot spot of chip 10.

Similarly, the contact pressure at the central region C3 of the active surface 12" of chip 10" (see also FIG. 1C) can be greater than the contact pressure of the chip 10" its four corners 321 at the front surface. In this example, pressure at the four corners 321 of active surface 12" of chip 10" may be approximately 0.16 MPa and a contact pressure at a central region C3 of chip may be approximately 0.18 MPa, such that contact pressure at a central region C3 of chip is 13.4% greater than the contact pressure at the four corners 321 of the chip. As shown, central region C3 can include any region or point on chip 10 that is in an area central to the four corners 321 of chip 10. For example, central region C3 can include either or both the portion of chip 10 overlying vent aperture 106 and portion of the cold plate extending immediately around the vent aperture. Central region C3 can further include the exact center of chip C3.

This increased contact pressure at a central portion of the chip can be beneficial to the extent that chips are generally hottest at their center. It is to be appreciated that these parameters provide only one example and that numerous modifications to the radius of curvature, thickness/width, and height of any one rib may be made, as well as modification to the pattern in which the ribs are arranged, the shape of the cold plate, and other parameters to achieve increased and optimal contact pressure.

Each of the above examples can achieve high contact pressure utilizing cold plates 100, 200 and 300. However, rib height H, rib thickness W, and the radius of curvature R of rib can be further optimized for different chip sizes and shapes to gain maximum performance and achieve high contact pressure between a chip 10 and cold plate 100. For example, the rib height H1 can be increased or decreased, the rib thickness or width W can be increased or decreased, and the diameter D of vent aperture 106 can be increased or decreased to gain maximum performance. Additionally, the pattern in which ribs 120 are arranged within cavity 110 can widely vary. Furthermore, it is to be appreciated that in other configurations, it may be desired for the rear surface of the chip to directly face the cold plate.

It is to be further appreciated that in the above examples, chips having a curvature have been joined to a cold plate having structures disclosed herein. However, in other examples, substantially and/or continuously planar chips may be utilized according to the methods and within the structures described throughout the entirety of this disclosure and variations thereof.

FIGS. 13-16 illustrate example alternative ribs, a plurality of which can be implemented within a cold plate to collectively form an alternative surface to which a chip may be attached according to aspects of the disclosure. As previously discussed, a radius of curvature R1 may be provided along a top surface 128 of the length of rib 120. A radius of curvature may additionally or alternatively be provided along a width of rib 120. For example, FIG. 13 illustrates both a radius of curvature R1' along a length of rib 120', as well as a radius of curvature R2 along a width W of rib 120'.

FIG. 14 presents another alternative rib 120". As shown, second end 124" of rib 120" is not flush with interior surface 112 of cavity 110. Instead, second end 124" may have a height H2" greater than "0", but less than a height H1" at the first end 122"d. If a plurality of alternative ribs 120" are implemented within a cold plate having a similar configuration as disclosed herein, each second end 124" of each rib 120" would have an edge 129" at second end 124" that would collectively create a wall having a height H2" extending around vent aperture 106.

With reference to FIG. 15, another alternative rib 120'" is shown, which does not include a radius of curvature along its length. Top surface 128'" instead maintains a constant slope that extends linearly from a first end having a height H1'" adjacent peripheral edge of cold plate to an opposed second end having a second height H2'" adjacent vent aperture 106 (not shown). Top surface 128'" will extend in a straight line towards vent aperture 106, as well as have a continuously planar surface.

Figure 16:
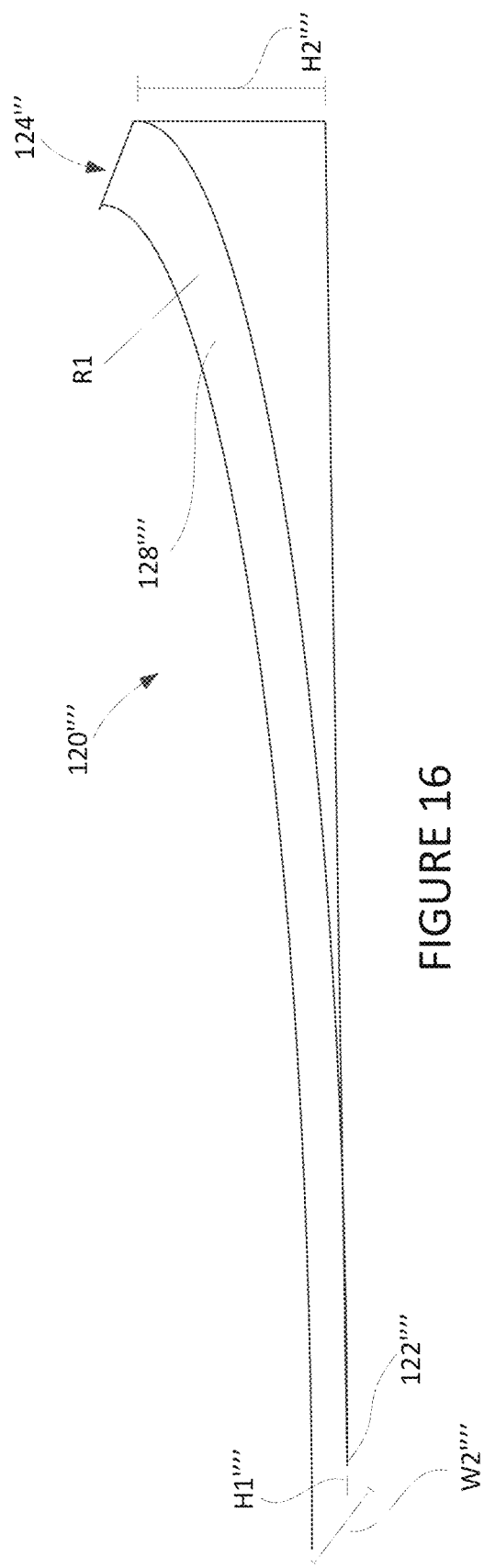
FIG. 16 is another example rib according to aspects of the disclosure.

FIG. 16 shown another alternative rib 120"" which is the mirror image of rib 120 discussed above. Rib 120"" has a height H2 adjacent the second end 124"" that is greater than a height H1"" at first end 122"". As a result, top surface 128"" of rib 120"" slopes in the opposite direction from second end 124 adjacent vent aperture 106 toward first end 122 adjacent peripheral edge 114. A plurality of ribs 120"" implemented in a same pattern as cold plate 100 disclosed herein would result in formation of a convex surface.

The disclosed heat distribution structure and methods of chip assembly allow for a relatively even distribution of contact pressure between the chip and the TIM. To increase the contact pressure, the features of the raised ribs can be modified, such as the thickness, height, and shape and direction of the slope of the rib.

Providing a plurality of ribs with alternative configurations within the cold plate can result in the formation of a different overall surface. For example, substituting rib 120"" in place of ribs 120 discussed above would result in the collective ribs 120"" forming a convex surface. This is because the second end 124'" of rib would be positioned adjacent the vent aperture 106 and the first end 124'" of rib would be adjacent peripheral edge 114. Thus, the highest point of the collective ribs would be at the center of cavity 110. This can be advantageous as this can help to ensure good contact pressure and thermal connection with a central portion of a chip that will be attached to the cold plate.

Similarly, any one of the aforementioned ribs and variations thereof can be arranged in numerous ways within the cavity, while still achieving increased contact pressure between a chip of larger size and the cold plate. By way of example, with reference back to FIGS. 4-6 and ribs 120, the width of the ribs 120 can be modified and increased in size so that fewer ribs are provided within the cavity. Similarly, second ends 124 of ribs 120 can be spaced further apart from one another to allow for the flow channels to have a larger opening adjacent the vent aperture 106. Similarly, the resulting patterns and arrangements of the ribs can differ. In other examples, select channels and ribs may extend in a direction towards the center of the cavity, whereas others may not. Alternatively, there may be no channels are ribs directed to the center of the cavity.

An example method of manufacturing a chip assembly 400 according to aspects of the disclosure is described in FIG. 17. At block 410, a heat distribution device is provided. The device includes a main body and an interior surface, a vent aperture extending through the interior surface and positioned within the main body, and a plurality of ribs concentrically arranged around the vent aperture and defining a plurality of channels therebetween. Each of the plurality of ribs include a top surface that slopes toward the vent aperture. The plurality of ribs are arranged so that the top surfaces of the plurality of ribs collectively form a non-planar surface within the heat distribution device. At block 420, a thermal interface material is deposited onto the interior surface of the main body. At block 430, a semiconductor chip is joined to the top surfaces of the ribs and the thermal interface material is positioned between the semiconductor chip and the ribs. At block 440, pressure can be applied to the exposed surface of the chip so as to cause the thermal interface material to be dispersed radially and tangentially across an opposed bottom surface of the chip and through the channels toward the vent aperture. Pressure can be directly applied by a person physically joining the chip and the cold plate or a tool implemented by a user joining the components together. Alternatively, if joinder occurs by an automated assembly process, pressure may be applied by an automated device or the like.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible implementations. Further, the same reference numbers in different drawings can identify the same or similar elements.

The invention claimed is:

1. A heat distribution device comprising:
   a main body;
   a recessed cavity positioned within the main body, the recessed cavity having an interior surface, a peripheral wall extending around and defining the interior surface, and a central point within the recessed cavity;
   a plurality of ribs extending away from the interior surface of the recessed cavity, the plurality of ribs concentrically arranged around the central point and defining a plurality of channels therebetween, each of the plurality of ribs having a top surface sloping toward the central point,
   wherein the plurality of ribs are arranged so that the top surfaces of the plurality of ribs collectively form a non-planar surface within the heat distribution device.

2. The heat distribution device of claim 1, wherein the top surface of each of the plurality of ribs includes a radius of curvature.

3. The heat distribution device of claim 2, wherein the non-planar surface is a concave surface.

4. The heat distribution device of claim 2, wherein the top surface of each of the plurality of ribs includes a radius of curvature, and wherein the non-planar surface is a convex surface.

5. The heat distribution device of claim 1, wherein the plurality of ribs include a first end and an opposed second end adjacent the central point, wherein the first end has a first height greater than a second height at the second end, and wherein the second end is flush with the interior surface of the recessed cavity.

6. The heat distribution device of claim 1, wherein the plurality of ribs include a first end and an opposed second end adjacent the central point, wherein the first end has a first height greater than a second height at the second end, and wherein an edge of the second end is flush with the interior surface of the recessed cavity.

7. The heat distribution device of claim 1, wherein the plurality of ribs include a first end and an opposed second end adjacent the central point, wherein the first end has a first height greater than a second height at the second end, wherein the second height extends away from the interior surface.

8. The heat distribution device of claim 1, wherein the heat distribution device further includes a vent aperture positioned at the central point.

9. A heat distribution device comprising:
a main body;
a vent aperture positioned within the main body;
a plurality of ribs concentrically arranged around the vent aperture and defining a plurality of channels therebetween, each of the plurality of ribs having a top surface sloping toward the vent aperture,
wherein the plurality of ribs are arranged so that the top surfaces of the plurality of ribs collectively form a non-planar surface within the heat distribution device.

10. The heat distribution device of claim 9, wherein the top surface of each of the plurality of ribs includes a radius of curvature, and wherein the non-planar surface is a concave surface.

11. The heat distribution device of claim 9, wherein the top surface of each of the plurality of ribs includes a radius of curvature, and wherein the non-planar surface is a convex surface.

12. The heat distribution device of claim 9, wherein each of the plurality of ribs includes a first end and an opposed second end, a first height of each rib being greater than a second height of each rib, the second end of each of the plurality of ribs being positioned adjacent the vent aperture.

13. The heat distribution device of claim 12, wherein the second end of each of the plurality of ribs is flush with a surface of the main body.

14. The heat distribution device of claim 13, wherein the second ends of the plurality of ribs are concentrically arranged and spaced apart from the vent aperture so as to form a central area between each of the second ends of the plurality of ribs and the vent aperture.

15. The heat distribution device of claim 9, wherein the heat distribution device further comprises a recessed cavity within the main body, and wherein the plurality of ribs are positioned within the recessed cavity.

16. The heat distribution device of claim 15, wherein a peripheral wall extends around the recessed cavity, and each of the plurality of ribs has a first end positioned directly adjacent the peripheral wall and a second end positioned directly adjacent the vent aperture.

17. A microelectronic assembly comprising:
a heat distribution device including a main body, a recessed cavity within the main body, a vent aperture within the cavity, a plurality of sloped ribs extending radially around the vent aperture, and a plurality of channels formed in respective spaces between each of the sloped ribs;
a semiconductor chip positioned at least partially within the recessed cavity and overlying the top surfaces of the sloped ribs, an active surface of the chip facing toward the plurality of sloped ribs; and
a thermal interface material disposed within the channels and between the semiconductor chip and a surface of the recessed cavity.

18. The microelectronic assembly of claim 17, wherein the semiconductor chip includes edge surfaces joined together and forming four corners, and wherein a first contact pressure between the semiconductor chip and the thermal interface material is higher at a central region of the semiconductor chip, than a second contact pressure at the four corners of the semiconductor chip, wherein the central region of the semiconductor chip includes portions of the semiconductor chip that overlie surfaces of the heat distribution device that extend circumferentially around the vent aperture.

19. The microelectronic assembly of claim 17, wherein a contact pressure between the semiconductor chip and the thermal interface material is evenly distributed across the active surface of the semiconductor chips.

20. A method of manufacturing a chip assembly comprising:
providing a heat distribution device comprising a main body having an interior surface, a vent aperture extending through the interior surface positioned within the main body, a plurality of ribs concentrically arranged around the vent aperture and defining a plurality of channels therebetween, each of the plurality of ribs having a top surface sloping toward the vent aperture, wherein the plurality of ribs are arranged so that the top surfaces of the plurality of ribs collectively form a non-planar surface within the heat distribution device,
depositing a thermal interface material onto the interior surface;
joining a microelectronic element to the top surfaces of the ribs, the thermal interface material being positioned between the microelectronic element and the ribs, and
applying pressure to the exposed surface of the microelectronic element so as to cause the thermal interface material to be dispersed radially and tangentially across an opposed bottom surface of the microelectronic element and through the channels toward the vent aperture.

* * * * *